United States Patent
Won et al.

(10) Patent No.: US 8,906,813 B2
(45) Date of Patent: Dec. 9, 2014

(54) SIO$_x$ PROCESS CHEMISTRY DEVELOPMENT USING MICROWAVE PLASMA CVD (71) Applicants: Tae Kyung Won, San Jose, CA (US); Seon-Mee Cho, Santa Clara, CA (US); Soo Young Choi, Fremont, CA (US); Beom Soo Park, San Jose, CA (US); Dong-Kil Yim, Pleasanton, CA (US); John M. White, Hayward, CA (US); Jozef Kudela, San Jose, CA (US)

(72) Inventors: Tae Kyung Won, San Jose, CA (US); Seon-Mee Cho, Santa Clara, CA (US); Soo Young Choi, Fremont, CA (US); Beom Soo Park, San Jose, CA (US); Dong-Kil Yim, Pleasanton, CA (US); John M. White, Hayward, CA (US); Jozef Kudela, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/886,175

(22) Filed: May 2, 2013

(65) Prior Publication Data

US 2013/0302999 A1 Nov. 14, 2013

Related U.S. Application Data (60) Provisional application No. 61/645,108, filed on May 10, 2012, provisional application No. 61/676,217, filed on Jul. 26, 2012.

(51) Int. Cl.
*H01L 21/31* (2006.01)
*H01L 21/02* (2006.01)
*C23C 16/40* (2006.01)
*C23C 16/455* (2006.01)
*C23C 16/511* (2006.01)
*C23C 16/54* (2006.01)

(52) U.S. Cl.
CPC ...... *H01L 21/0262* (2013.01); *H01L 21/02164* (2013.01); *H01L 21/02211* (2013.01); *H01L 21/02274* (2013.01); *C23C 16/401* (2013.01); *C23C 16/45578* (2013.01); *C23C 16/511* (2013.01); *C23C 16/545* (2013.01)
USPC ........................................................ 438/788

(58) Field of Classification Search
CPC ................... H01L 21/02107; H01L 21/02225; H01L 21/0226
USPC .................................................... 438/787, 788
See application file for complete search history.

(56) References Cited

U.S. PATENT DOCUMENTS 4,778,561 A * 10/1988 Ghanbari ......................... 216/70
4,962,063 A * 10/1990 Maydan et al. ................ 438/699

(Continued)

FOREIGN PATENT DOCUMENTS

JP         02156526 A  *  6/1990
KR     2012-0004724 A       1/2012

OTHER PUBLICATIONS

Machida et al, "SiO2 planarization technology hwith biasing and electron cyclotron resonance plasma deposition for submicron interconnections" Journal of Vacuum Science & Technology, 4 (1986): pp. 818-821.*

(Continued)

*Primary Examiner* — Michele Fan
(74) *Attorney, Agent, or Firm* — Patterson & Sheridan, LLP (57) ABSTRACT

Methods for processing a substrate are described herein. Methods can include positioning a substrate in a processing chamber, maintaining the processing chamber at a temperature below 400° C., flowing a reactant gas comprising either a silicon hydride or a silicon halide and an oxidizing precursor into the process chamber, applying a microwave power to create a microwave plasma from the reactant gas, and depositing a silicon oxide layer on at least a portion of the exposed surface of a substrate.

13 Claims, 2 Drawing Sheets

(56) References Cited

U.S. PATENT DOCUMENTS

| | | | | |
|---|---|---|---|---|
| 4,988,533 | A | * | 1/1991 | Freeman et al. ............... 427/563 |
| 5,279,865 | A | * | 1/1994 | Chebi et al. ................... 427/574 |
| 5,348,773 | A | * | 9/1994 | Michael et al. ............... 427/540 |
| 5,449,411 | A | | 9/1995 | Fukuda et al. |
| 5,525,550 | A | * | 6/1996 | Kato .............................. 438/788 |
| 5,626,679 | A | * | 5/1997 | Shimizu et al. ........ 118/723 MR |
| 5,637,358 | A | | 6/1997 | Otoshi et al. |
| 5,670,224 | A | * | 9/1997 | Izu et al. ....................... 428/35.8 |
| 5,811,872 | A | * | 9/1998 | Machida et al. ............... 257/635 |
| 5,939,831 | A | * | 8/1999 | Fong et al. ............... 315/111.21 |
| 6,042,901 | A | * | 3/2000 | Denison et al. ............... 427/579 |
| 6,077,574 | A | | 6/2000 | Usami |
| 6,106,678 | A | * | 8/2000 | Shufflebotham et al. ....................... 204/192.32 |
| 6,149,986 | A | * | 11/2000 | Shibata et al. ................. 427/571 |
| 6,340,843 | B1 | * | 1/2002 | Usami ........................... 257/758 |
| 6,407,011 | B1 | * | 6/2002 | Ikeda et al. ................... 438/786 |
| 7,129,187 | B2 | | 10/2006 | Joe |
| 7,622,151 | B2 | | 11/2009 | Tzeng |
| 2001/0016428 | A1 | * | 8/2001 | Smith et al. ................... 438/784 |
| 2001/0054387 | A1 | * | 12/2001 | Frankel et al. ................ 118/725 |
| 2003/0115909 | A1 | | 6/2003 | House et al. |
| 2003/0159656 | A1 | * | 8/2003 | Tan et al. ................. 118/723.001 |
| 2004/0200417 | A1 | * | 10/2004 | Hanawa et al. ......... 118/723.001 |
| 2005/0079715 | A1 | * | 4/2005 | Hua et al. ....................... 438/689 |
| 2005/0136604 | A1 | * | 6/2005 | Al-Bayati et al. ............. 438/301 |
| 2005/0205015 | A1 | * | 9/2005 | Sasaki et al. ........... 118/723 MA |
| 2005/0255667 | A1 | * | 11/2005 | Arghavani et al. ............ 438/405 |
| 2006/0154494 | A1 | * | 7/2006 | Qi et al. ......................... 438/787 |
| 2006/0211267 | A1 | * | 9/2006 | Joshi et al. ..................... 438/778 |
| 2006/0225648 | A1 | * | 10/2006 | Rasheed et al. ............... 118/692 |
| 2007/0155137 | A1 | | 7/2007 | Joshi et al. |
| 2008/0115801 | A1 | * | 5/2008 | Chin et al. ...................... 134/1.2 |
| 2008/0296724 | A1 | | 12/2008 | Yamazaki et al. |
| 2009/0075489 | A1 | * | 3/2009 | Wang et al. .................... 438/787 |
| 2009/0104791 | A1 | | 4/2009 | Nemani et al. |
| 2009/0120366 | A1 | | 5/2009 | Ueda et al. |
| 2009/0140257 | A1 | * | 6/2009 | Oka ................................. 257/66 |
| 2009/0218044 | A1 | | 9/2009 | Ohmi et al. |
| 2010/0041207 | A1 | * | 2/2010 | Lee et al. ....................... 438/435 |
| 2010/0105195 | A1 | * | 4/2010 | Roca I Cabarrocas et al. ............................. 438/485 |
| 2010/0200954 | A1 | * | 8/2010 | Del Agua Borniquel et al. ............................. 257/607 |
| 2010/0216300 | A1 | | 8/2010 | Ueda et al. |
| 2011/0074013 | A1 | | 3/2011 | Ueda et al. |
| 2011/0272593 | A1 | * | 11/2011 | Graf et al. ................. 250/423 R |

OTHER PUBLICATIONS

International Search Report for related application PCT/US2013/039341 dated Sep. 13, 2013.

\* cited by examiner

SIO_x PROCESS CHEMISTRY DEVELOPMENT USING MICROWAVE PLASMA CVD

CROSS-REFERENCE TO RELATED APPLICATIONS

This application claims benefit of U.S. Provisional Patent Application Ser. No. 61/645,108, filed May 10, 2012 (APPM/17503L) and of U.S. Provisional Patent Application Ser. No. 61/676,217 (APPM/17503L02), filed Jul. 26, 2012. Both are incorporated by reference herein.

BACKGROUND OF THE INVENTION

1. Field of the Invention

Technology described herein relates to deposition of thin films using microwave deposition.

2. Description of the Related Art

Silicon-containing films are used for a wide variety of applications in the semiconductor industry. Silicon-containing films include silicon films such as silicon oxide ($SiO)_x$), polycrystalline silicon (poly-Si) and epitaxial silicon, microcrystalline silicon ($\mu c$-Si), amorphous silicon (a-Si), silicon germanium (SiGe), silicon germanium carbide (SiGeC), silicon carbide (SiC), silicon nitride (SiN), silicon carbonitride (SiCN), and silicon carboxide (SiCO). The silicon-containing films may be formed by a plasma process.

In general, plasma processing involves positioning a substrate on a support member (often referred to as a susceptor or heater) disposed in a vacuum chamber and forming a plasma adjacent to the upper exposed surface of the substrate. The plasma is formed by introducing one or more process gases into the chamber and exciting the gases with an electrical field to cause dissociation of the gases into charged and neutral particles. A plasma may be produced inductively, e.g., using an inductive RF coil, and/or capacitively, e.g., using parallel plate electrodes, or by using microwave energy.

Many plasma processes employ capacitance coupled plasma (CCP) for the formation of the activated species to deposit on the substrate. However, the explosive behavior of $SiH_4$ and corrosive behavior of $SiF_4$ requires strict control over processing conditions and careful handling of the process effluent. Furthermore, deposition of $SiO_x$ films from $SiF_4$ require high deposition temperatures that are incompatible with advanced device processing requiring a low thermal budget.

Thus, methods are needed that can provide lower temperature deposition of thin films with higher deposition rates and lower defect rates.

SUMMARY OF THE INVENTION

Embodiments described herein generally relate to the deposition of a silicon oxide film on a substrate. In one embodiment, a method of depositing a film on a substrate can include positioning a substrate in a processing chamber, maintaining the processing chamber at a temperature below 330° C., flowing a reactant gas comprising a fluorine-containing silicon precursor and an oxidizing precursor into the process chamber, wherein the oxidizing precursor is selected from a group comprising $O_2$, $O_3$, and $N_2O$ and wherein the fluorine-containing silicon precursor to oxidizing precursor gas ratio is between 10:1 and 47:1, applying a microwave power to create a microwave plasma from the reactant gas, wherein the reactant gas is mixed prior to forming the microwave plasma, and depositing a silicon oxide layer on at least a portion of the exposed surface of a substrate.

In another embodiment, a method of depositing a film on a substrate can include positioning a substrate in a processing chamber, maintaining the processing chamber at a temperature below 200° C., flowing a reactant gas comprising a silane precursor and an oxidizing precursor into the process chamber, wherein the oxidizing precursor is selected from a group comprising $O_2$, $O_3$, and $N_2O$ and wherein the silane precursor to oxidizing precursor gas ratio is between 7:1 and 33:1, applying a microwave power to create a microwave plasma from the reactant gas, wherein the reactant gas is mixed prior to forming the microwave plasma, and depositing a silicon oxide layer on at least a portion of the exposed surface of a substrate.

In another embodiment, a method of depositing a film on a substrate can include positioning a substrate in a processing chamber, wherein the processing chamber is configured to deliver microwave energy from at least two positions, maintaining the processing chamber at a temperature less than 200° C., mixing $SiH_4$ and $O_2$ to create a processing gas, wherein the $SiH_4$ to $O_2$ gas ratio is between 7:1 and 33:1, flowing the processing gas into the processing chamber, applying a microwave power to the processing gas to create a microwave plasma, and depositing a silicon oxide layer on at least a portion of the exposed surface of a substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings.

It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Methods for depositing a silicon containing layer on a substrate using a microwave deposition technique are described below. Using microwave (MW) plasma, various kinds of processes, such as $SiO_x$ can be made. The processes can be made with various source gases like $SiH_4$, $SiF_4$, $N_2O$, and $O_2$. Better quality of $SiO_x$ film can be developed using microwave deposition techniques, such as with microwave plasma enhanced chemical vapor deposition (MW-PECVD), compared to other plasma deposition techniques, such as capacitance coupled plasma—plasma enhanced chemical vapor deposition (CCP-PECVD).

Depending on film requirements, a skilled artisan can choose the right source gas chemistry to control various conditions. A plasma can be created from one or more of source gases above and used to deposit a silicon containing layer on the substrate by a CVD process, such as a SiOx layer by a MW-PECVD process.

By using microwave plasma, various kinds of source gases can be utilized to make various SiO films at low temperature with wide process window, compared to capacitance coupled plasma (CCP)-SiO deposition process. Embodiments of the invention are more clearly described with reference to the figure below.

The embodiments described below can be practiced in a PECVD chamber available from AKT America, Inc., a subsidiary of Applied Materials, Inc., Santa Clara, Calif. It is to be understood that the invention has applicability in other chambers as well, including apparatus available from other manufacturers.

Figure 1:
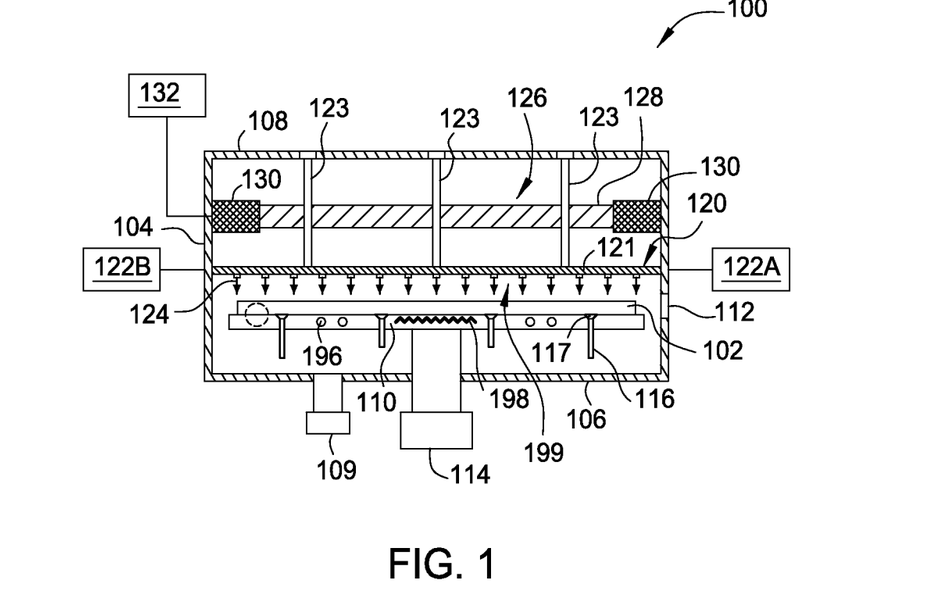
FIG. 1 is an illustration of a chemical vapor deposition (CVD) chamber according to one embodiment.

FIG. 1 is a cross-sectional view of a schematic coaxial microwave plasma-assisted CVD chamber according to one embodiment of the invention. A process chamber 100 is configured to allow one or more films to be deposited onto a substrate 102 without removing the substrate 102 from the process chamber 100. While the description below will be made in reference to a microwave plasma-assisted CVD chamber, particularly to a horizontal-type chamber where the microwave and gas feeding sources are disposed above a horizontally positioned substrate susceptor for a horizontal deposition process, it is to be understood that the present invention may be applied to those vertical-type deposition chambers with the microwave line sources vertically attached to chamber walls of the process chamber, and a vertically positioned substrate susceptor for supporting a substrate in vertical configuration. In addition, it should be noted that the Figures and the corresponding description are merely exemplary, and any individual hardware feature described in a single embodiment can be combined with any of other embodiments described in the specification.

The substrate 102 may be, among others, a thin sheet of metal, plastic, organic material, silicon, glass, quartz, or polymer materials. In one embodiment, the substrate 102 is a glass substrate upon which a silicon-containing dielectric will be deposited. In other embodiments, the substrate 102 may be doped or otherwise modified glass substrate. The substrate 102 may have a surface area greater than about 1 square meter, such as greater than about 2 square meters. The present invention can be used for deposition of a silicon-containing layer (e.g., $SiO_x$) on large-sized substrates having a plan surface area of about 15,600 $cm^2$, or greater, for example about a 90,000 $cm^2$ plan surface area. The process chamber 100 may be configured to deposit a variety of materials on the substrates 102, including but not limited to dielectric materials (e.g., $SiO_2$, $SiO_xN_y$, derivatives thereof or combinations thereof), semiconductive materials (e.g., Si and dopants thereof), barrier materials (e.g., $SiN_x$, $SiO_xN_y$, or derivatives thereof), or amorphous silicon or microcrystalline silicon thin film transistor (TFT) passivated by silicon-containing dielectric layer. Specific examples of dielectric materials and semiconductive materials that are formed or deposited by the process chamber 100 onto the large area substrates may include, but is not limited to epitaxial silicon, polycrystalline silicon, amorphous silicon, microcrystalline silicon, silicon germanium, germanium, silicon dioxide, silicon oxynitride, silicon nitride, dopants thereof (e.g., B, P, or As), derivatives thereof or combinations thereof. The process chamber 100 is also configured to receive gases such as argon, hydrogen, nitrogen, helium, or combinations thereof, for use as a purge gas or a carrier gas (e.g., Ar, $H_2$, $N_2$, He, derivatives thereof, or combinations thereof).

The process chamber 100 generally includes chamber walls 104, a chamber bottom 106 and a chamber lid 108 which define a process volume 199 therein. The process volume 199 is coupled to a vacuum system 109 and has a substrate susceptor 110 disposed therein. The process volume 199 is accessed through a slit valve opening 112 such that the substrate 102 may be transferred in and out of the process chamber 100. The chamber walls 104, chamber bottom 106, and the chamber lid 108 may be fabricated from a unitary block of aluminum or other material compatible for plasma processing. The chamber lid 108 is supported by the chamber walls 104 and can be removed to service the process chamber 100. The substrate susceptor 110 may be coupled to an actuator 114 to raise and lower the substrate susceptor 110.

The substrate susceptor 110 may optionally include heating and/or cooling elements to maintain the substrate susceptor 110 at a desired temperature. For example, the substrate susceptor 110 may include a resistive heater 198 and/or cooling fluid conduits 196 which are utilize to control the temperature of the substrate 102 disposed on the substrate susceptor 110 during deposition.

Lift pins 116 are moveably disposed through the substrate susceptor 110 to controllably support the substrate 102 prior to placement onto the substrate susceptor 110 and after removal from the substrate susceptor 110. The lift pins 116 are typically comprised of ceramic or anodized aluminum. Generally, the lift pins 116 have first ends 117 that are substantially flush with or slightly recessed from a top surface of the substrate susceptor 110 when the lift pins 116 are in a normal position (i.e., retracted relative to the substrate susceptor 110). The first ends 117 are generally flared or otherwise enlarged to prevent the lift pins 116 from falling through the holes. The lift pins 116 come in contact with the chamber bottom 106 and are displaced from the top surface of the substrate susceptor 110, thereby placing the substrate 102 in a spaced-apart relation to the substrate susceptor 110. In one embodiment, lift pins 116 of varying lengths are utilized so that they come into contact with the bottom 106 and are actuated at different times.

The major components of the process chamber 100 in accordance with the present invention may include, among others, a gas feeding source 120 and a coaxial microwave source 126. The coaxial microwave source 126 may include one or more microwave antennas 128 that are configured to be parallel to the longitudinal direction of the gas feeding source 120. The gas feeding source 120 may be located between the coaxial microwave source 126 and the substrate 102. Optionally, a second gas feeding source (not shown) may be located above the coaxial microwave source 126 and near the top (e.g., the chamber lid 108) of the process chamber 100 to improve the deposition rate.

The gas feeding source 120 may include an array of gas feeding lines 121 that are configured to controllably receive one or more precursor gases and carrier gas from a gas source 122A and/or gas source 122B. The gas feeding lines 121 can be a planar arrangement and may be movably supported by, for example, 3 supporting elements 123. The supporting elements 123 may be made from any suitable materials such as an electrically insulating material. In one example, each supporting elements 123 may have at least 3 fastening mechanisms (not shown) such as nut and bolt assembly, or any other suitable means, disposed along the length of the supporting elements 123 and configured to hold a portion of the gas feeding lines 121. The configuration of the supporting elements 123 may vary depending upon application or the number of the gas feeding lines 121 used. Any other supporting mechanism is conceivable as long as the configuration does not significantly affect the film uniformity and/or microwave power from the microwave antennas 128. In certain embodiments, the gas feeding lines 121 may be supported through chamber walls 104 without the use of supporting elements 123.

While not discussed in detail here, it is contemplated that the supporting elements 123 are vertically (or horizontally) adjustable so that a narrower or wider space between the coaxial microwave source 126 and the gas feeding source 120 can be obtained. It is also contemplated that the position of the gas feeding source 120 may be adjusted in the vertical axis to be closer or away from the substrate depending upon processing parameters to obtain desired film properties.

The array of gas feeding lines 121 are arranged parallel and longitudinally spaced from each other, and each of the plurality of gas feeding lines 121 has perforated holes (not shown) facing the substrate 102. The holes are arranged at substantially regular intervals along the length of the gas feeding lines 121 to provide a substantially uniform gas flow covering substantially the upper surface of the substrate 102. The gas feeding source 120 may include about 3 to about 20 gas feeding lines 121, depending upon the size of the substrate. It has been observed that a single gas feeding line 121 may cover about 100 mm area in the normal direction with about 10% non-uniformity. For a substrate having a size of 730 mm×920 mm, the gas feeding source 120 may have 10 gas feeding lines 121. The distance between the gas feeding lines 121 (i.e., a gas feeding line to an immediate adjacent gas feeding line) may vary upon application between about 50 mm and about 200 mm, such as between about 100 mm and about 130 mm, for example about 110 mm. The length of each gas feeding lines 121 may vary depending upon the size of the substrate 102. The length of each of the gas feeding lines 121 may be up to about 2.5 m, i.e., longer than the diameter of the substrate 102 to obtain full coverage of the substrate being processed.

The array of gas feeding lines 121 may receive one or more precursor gases and carrier gas from a gas source 122A and/or gas source 122B. The precursor gases may vary depending upon the application. In cases where a silicon-containing dielectric layer is desired, the precursor gas such as $SiH_4$ and $NH_3$ and carrier gas, for example, Ar, may be provided together or separately from a gas supply to the gas source 122A and 122B, respectively, before entering the gas feeding lines 121. As the film thickness is strongly dependent on the gas feeding position, that is, the gas feeding sides always induces higher deposition rate due to higher gas flows at the side, having gases fed from both sides of the gas feeding lines 121 is believed to enhance the uniformity of the film thickness.

The coaxial microwave source 126 may be located between the gas feeding source 120 and the top (e.g., the chamber lid 108) of the process chamber 100. The coaxial microwave source 126 generally includes the microwave antennas 128 and a coupling mechanism 130 connected to the microwave antennas 128. The coaxial microwave source 126 may be coupled to ground. In one embodiment, the coaxial microwave source 126 can be a planar arrangement in which the microwave antennas 128 are arranged parallel and longitudinally spaced from each other. While only one microwave antenna 128 is shown, it is contemplated that the number of the microwave antennas 128 may be increased depending upon the size of the substrate. For a substrate having a size of 730 mm×920 mm, the coaxial microwave source 126 may have four microwave antennas 128. In various embodiments, the distance in the Y-axis between the adjacent microwave antennas 128 may be about 100 mm to about 500 mm, for example between about 180 mm and about 350 mm, such as 230 mm. A wider spacing may cause a dip profile and non-uniform film properties on substrate surface areas between the microwave generators. Each of the two microwave antennas 128 may be disposed respectively above and in between two adjacent gas feeding lines 121. It has been observed that a single microwave antenna 128 may cover about 260 mm area in the normal direction with about 10% non-uniformity.

The length of each microwave antenna 128 may be equal or longer than the gas feeding lines 121. For example, the length of each microwave antenna 128 may be up to about 3 m. In some embodiments of the invention, the coaxial microwave source 126 may be moved along a horizontal direction perpendicular to the X-axis of the substrate 102. This can be done in order to process a large substrate. For example, if the substrate has a dimension of 16 feet long and 3-4 feet wide, the coaxial microwave source 126 may need to be moved along the length of the substrate. However, if the substrate has a dimension of 16 feet long and 16 feet wide, the coaxial microwave source 126 may need to be moved along both the length and the width of the substrate.

A microwave source 132 is connected to the coaxial microwave source 126 and can input microwaves into the coupling mechanism 130. In operation during a process, such as a deposition process, the microwaves travel along the microwave antennas 128 and go through a high attenuation by converting electromagnetic energy into plasma energy which ignites a plasma within the process volume. Radical species generated by the plasma disassociates the reactive precursors coming from the gas feeding lines 121, which are directed toward the substrate 102 (as indicated by arrows 124) and uniformly distributed radically across the substrate surface, typically in laminar flow, to form a film on the substrate 102 that is held by the substrate susceptor 110. Pressure within the chamber during deposition is controlled by a vacuum system 109.

Figure 2:
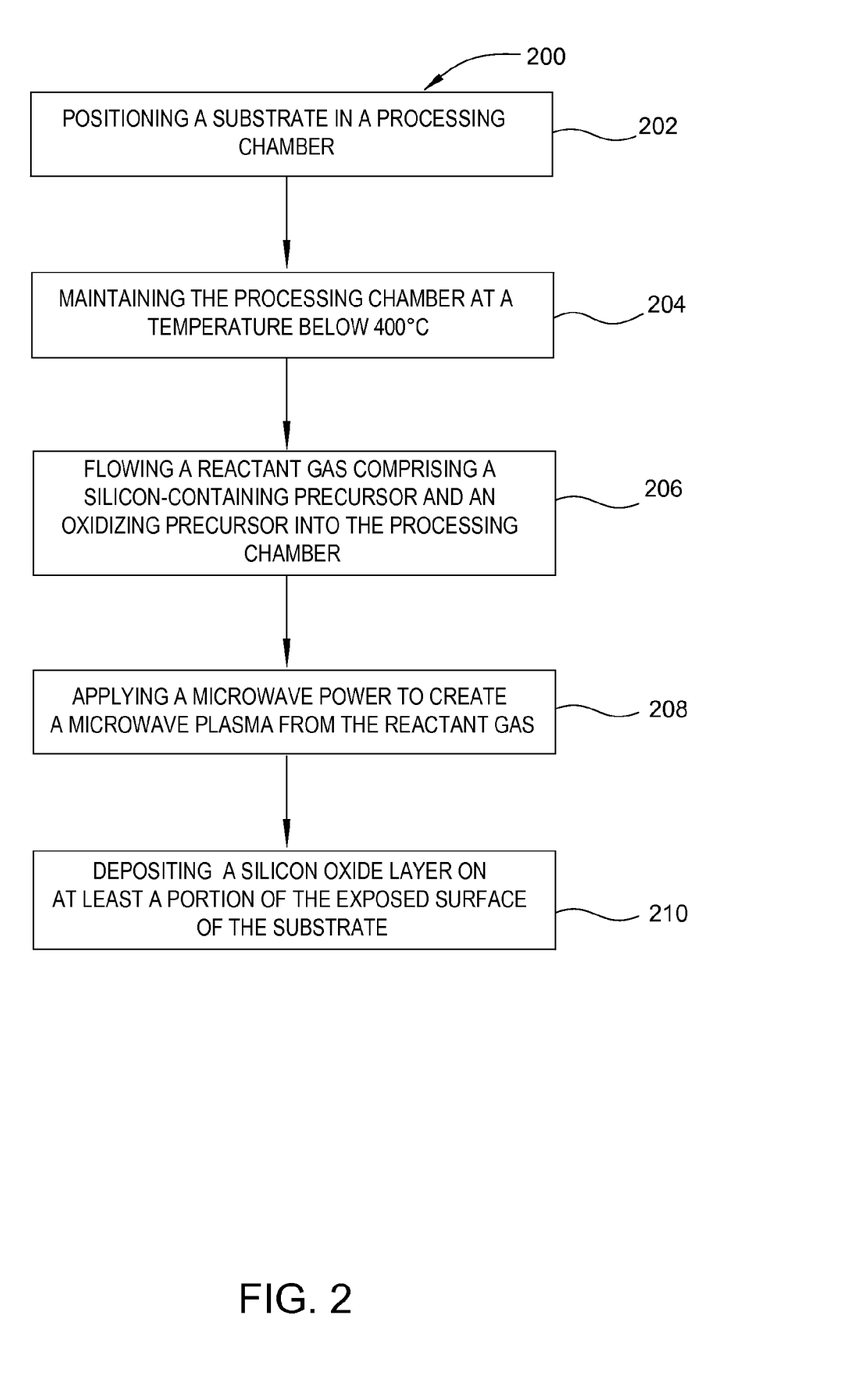
FIG. 2 is a flow diagram of the method of depositing a silicon-containing layer according to one embodiment.

FIG. 2 is a flow diagram of the method of depositing a silicon-containing layer according to one embodiment. The method 200 for processing a substrate can include positioning a substrate in a processing chamber, as in step 202. The processing chamber can be similar in design as the exemplary embodiment above. The dimensions of the chamber body and related components of the processing chamber are not limited and generally are proportionally larger than the size of a substrate to be processed.

The substrate may be composed of any suitable substrate material. Suitable substrate materials can include but are not limited to glass, quartz, sapphire, germanium, plastic or composites thereof. Additionally, the substrate can be a relatively rigid substrate or a flexible substrate. Further, any suitable substrate size may be processed. Examples of suitable substrate sizes include substrate having a surface area of about 2000 centimeter square or more, such as about 4000 centimeter square or more, for example about 10000 centimeter square or more. In one embodiment, a substrate having a surface area of about 50000 centimeter square or more may be processed. The embodiments described below are in relation to a 5500 centimeter square substrate.

The method 200 can also include maintaining a processing chamber at a temperature below 400° C., as in step 204. Deposition at temperatures higher than 400° C. can lead to spontaneous conversion of SiO to Si and $SiO_2$, thus disturbing characteristics of the deposited layer. CCP deposition of silicon hydrides and silicon halides requires relatively high temperatures for efficient deposition and low pinhole density. The use of microwave plasma allows for deposition of a high quality film at relatively low temperatures in comparison to films produced in CVD processes employing CCP or inductively coupled plasma.

By using lower temperatures, such as temperatures between 100° C. and 350° C., with preferred embodiments between 130° C. and 200° C., a largely hydrogen-free and pinhole-free layer can be deposited from microwave activated precursors while avoiding the some of the deleterious effects of using silane ($SiH_4$) and some oxidizing precursors. Temperature will preferably be higher when using silicon tetrafluoride ($SiF_4$), as a higher quality and higher deposition rate $SiO_x$ can be deposited at temperatures between 200° C. and 350° C., such as from 230° C. to 330° C.

The method 200 can also include flowing a reactant gas comprising a silicon-containing precursor and an oxidizing precursor into the processing chamber, as in step 206. The reactant gas comprises a mixture of a silicon-containing precursor and an oxidizing precursor. The reactant gas mixture can also include inert gases, such as noble gases, to maintain a specific deposition rate, pressure or flow rate. Typical inert gases can include argon (Ar), neon (Ne), helium (He), krypton (Kr), or xenon (Xe).

Silicon-containing precursors can include silicon hydrides, such as $SiH_4$, silicon halides, such as $SiF_4$, or combinations thereof. The silicon-containing precursor can be flowed into a processing chamber for deposition of a $SiO_x$ film. In an exemplary chamber, flow rates for silicon hydrides, such as $SiH_4$, and silicon halides, such as $SiF_4$, can be from 100 sccm to 500 sccm, for example flow rates from 150 sccm to 450 sccm, such as a flow rate of 350 sccm.

The oxidizing precursor can include diatomic oxygen ($O_2$), ozone ($O_3$), nitrous oxide ($N_2O$) or other oxidizing gases. The oxidizing precursor can be flowed into a processing chamber alongside silicon hydrides and silicon halides. In an exemplary chamber, such as the one described above, flow rates for $O_2$, $O_3$ or $N_2O$ when deposited with silicon hydrides can be from 2000-5000 sccm, such as a flow rate of 3500 sccm. In another embodiment, flow rates for $O_2$ or $O_3$ when deposited with silicon halides can be from 5000 to 7000 sccm, such as a flow rate of 5500 sccm. In another embodiment, flow rates for $N_2O$ when deposited with silicon halides can be from 3000 to 7000 sccm, such as a flow rate of 4000 sccm.

Though the reaction mix may vary as described above in relation to the exemplary chamber, the ratio of $SiH_4$ to oxidizing precursor can be from 7:1 to 33:1. In another embodiment, the ratio of $SiF_4$ to oxidizing precursor can be from 10:1 to 47:1, such as 11:1 to 47:1, for example 23:1.

The pressure of the reactant gas can be maintained relatively low with comparison to capacitance coupled plasma, with embodiments from 100 to 300 mTorr, such as 100 mTorr of pressure. As previously discussed, some embodiments may require the use of an inert gas, such as a noble gas, to match specific pressure, flow rate and ratio parameters.

The method 200 can further include applying a microwave power to create a microwave plasma from the reactant gas, as in step 208. The reactant gas which is converted to plasma can be converted as a gaseous mix or as separate components. For example, the oxidizing precursor may be converted to plasma, to which the silicon-containing precursor is added prior to coming in contact with the substrate. Further embodiments can include an inert gas, such as a noble gas, converted to plasma using a microwave power source. The silicon-containing precursor and the oxidizing precursor can then be added to the plasma creating the activated reactant gas.

The microwave power can have a relatively high power, such as a microwave power between 3000 W and 5000 W, for example a microwave power of 4000 W. The microwave power may be directed by one or more antennas, such as six antennas. The antennas can be positioned so as to maintain the plasma until it reaches the substrate.

The method 200 can also include depositing a silicon oxide layer on at least a portion of the exposed surface of the substrate, as in step 210. Deposited silicon oxide $SiO_x$ can include $SiO_2$, SiO, or combinations thereof. The formation of the $SiO_x$ layer can be controlled by deposition factors such as temperature, pressure, flow rate of reactant gas and amount of microwave power applied among other factors.

Particularly important is the sensitivity of SiO to temperature. Without wishing to be bound by theory, SiO is believed to undergo spontaneous conversion from SiO to Si and $SiO_2$ in the presence of temperatures above 400° C. As such, maintaining temperature as low as possible, such as temperatures between 100° C. and 350° C., with preferred embodiments of less than 200° C., is important to the maintenance of the characteristics of the $SiO_x$ layer as deposited.

Deposition rates for $SiO_x$ which can be expected from embodiments described here can range from 630 Å/min up to 2200 Å/min, depending on the composition of the reactant gas, the temperature used, the microwave power applied to the reactant gas, and flow rates among other factors. Experimental evidence shows the pinhole formation of no higher than 28 per $mm^2$ as opposed to a maximum of approximately 400 per $mm^2$ with a $SiO_x$ layer deposited using CCP.

It is important to note that the ratios described here reflect a significantly lower quantity of reactant gases for a higher quality film with a higher deposition rate. The deposited layer is lower in pinhole formation with lower hydrogen content and deposited at lower temperatures. Further, due to exothermic reactions between $SiH_4$ and $O_2$ or $O_3$, CCP deposition of $SiO_x$ using these reactants is not favored and, if used, must be carefully controlled. The use of a microwave plasma at lower temperatures reduces the threat of a volatile reaction between $SiH_4$ and $O_2$ or $O_3$ and allows for different process chemistries than were previously available.

Without intending to be bound by theory, reduction in hydrogen concentration is important in the creation of various features on a substrate, such as gates, etch stops and spacers. Hydrogen is a ubiquitous impurity in $SiO_x$ and is believed to be responsible for fixed charge in the oxide. Release of hydrogen during operation is believed to be responsible for the creation of defects such as trap generation which can lead to intrinsic dielectric breakdown. As such, reduced hydrogen concentration is believed to be important to avoidance of such defects.

Related to hydrogen generated defects, pinholes act as physical portals to the flow of hydrogen into the layer formed on a substrate. As such, it is important to both reduce hydrogen concentration and to reduce pathways for hydrogen to enter into the $SiO_x$ film. Since microwave plasma is much denser, the number of pinholes formed in the layer is diminished, thereby protecting from hydrogen based defects in a feature.

In another embodiment, the plasma can be formed in a remote chamber using a microwave power source. The microwave power source can deliver microwave power for the formation of the microwave plasma. The microwave power can be between 3500 W and 4500 W, such as 4000 W. The microwave power can be directed using one or more antennas. The microwave power source can be coupled with either the remote plasma source alone or coupled with both the processing chamber and the remote plasma source.

The microwave plasma can be formed using the microwave power and the reactant gas or components thereof. For example, the microwave plasma can be a mixture of the silicon-containing precursor, the oxidizing precursor and the optional inert gas, activated by a microwave power source. Further examples, can include the formation of plasma from one or more of the silicon-containing precursor, the oxidizing precursor or the optional inert gas in any combination. Once activated, the remaining precursors can be added to the activated gas. The remaining precursors can be added to the activated gas either at the remote plasma source or in the processing chamber. The remaining precursors may be added to the activated gas when the activated gas is either in a plasma state or after the plasma state has quenched to create an activated reactant gas.

The activated reactant gas or components thereof can be flowed into the processing chamber. Further, the activated reactant gas can be allowed to quench before reaching the processing chamber or it can be maintained as a plasma using a microwave power source coupled to the processing chamber. The activated reactant gas can be flowed to the substrate for deposition of the $SiO_x$ layer.

In general, plasmas are used to allow the chemical reaction of a CVD process to occur at lower temperatures. However, temperatures must be still maintained to control the characteristics of the layer which is deposited. It is believed that, since microwave power creates a denser plasma, the precursors described above can be deposited at lower temperatures while still achieving characteristics which are either only available with CCP plasmas at higher temperatures or not at all within known processing parameters.

EXAMPLES

Described below are examples from experimental data using one or more of the embodiments disclosed previously. Exemplary embodiments described herein are described with reference to an AKT-5500 PX PECVD chamber available from Applied Materials, Inc. located in Santa Clara, Calif. The 5500 PX PECVD chamber is generally is sized to process a substrate having a surface area of 5500 centimeter square. It is to be understood that embodiments described herein can be scaled up or down to compensate for different sized substrates and different sized chambers.

A first control example shows a range of SiO layer characteristics for layers which were deposited by CCP-PECVD using $SiH_4$ and $N_2O$ gases. $SiH_4$ and $O_2$ were not used in CCP-PECVD due to the volatility of the gas combination using CCP plasma. The depositions were performed at 230° C. The flow rate of the $SiH_4$ gas was from 200 sccm to 350 sccm. The flow rate of the $N_2O$ gas was from 10000 sccm to 18000 sccm. The capacitive power was supplied to the plasma at from 1500 W to 2300 W. Pressure was maintained at between 700 mTorr to 1500 mTorr with a spacing of 600-750 mil.

The range of deposition rates achieved, listed in relation to the 230° C. example, was from 200 Å/min up to 1500 Å/min. The range of refractive index for the deposited layer was from 1.466 to 1.474. The range of SiO peak position was from 1066 to 1074. The range of intrinsic stress for deposited layers was from $2.6*10^9$ d/cm$^2$ to $4.3*10^9$ d/cm$^2$. The range of wet etch rate for the deposited layer was from 2200 Å/min to 3000 Å/min. The hydrogen content of the deposited layer was from 4.0 to 5.0 atomic percent. The flat band voltage ($V_{fb}$) of the deposited layer as deposited was from −2.7V to −9.8V. When heated to 500° C. for 30 min, the $V_{fb}$ was from −0.5V to −9.0V. The breakdown voltage ($V_{bd}$) of the deposited layer was 8.0 MV/cm. When heated to 500° C. for 30 min, the $V_{bd}$ saw no calculable change. The pinhole density of the deposited layer was between 150 pinholes/mm$^2$ and 400 pinholes/mm$^2$.

A second control example shows SiO layer characteristics for layers which were deposited by CCP-PECVD using $SiF_4$ and $N_2O$ gases. The deposition was performed at 330° C. The flow rate of the $SiF_4$ gas was from 10 sccm to 300 sccm. The flow rate of the $N_2O$ gas was 7000 sccm. The capacitive power was supplied to the plasma at 1300 W. Pressure was maintained at 1000 mTorr with a spacing of 600-750 mil.

The deposition rates achieved were at 200 Å/min. The refractive index for the deposited layer was approximately 1.368. The SiO peak position was 1103. The intrinsic stress for the deposited layer was $2.0*10^8$ d/cm$^2$. The wet etch rate for the deposited layer was greater than 10000 Å/min. The hydrogen content of the deposited layer was 4.5 atomic percent. The flat band voltage ($V_{fb}$) of the deposited layer as deposited was from −16V to −17V. When heated to 500° C. for 30 min, the $V_{fb}$ was from −9V to −10V. The breakdown voltage ($V_{bd}$) of both deposited layers as deposited was from 5 MV/cm to 6 MV/cm. When heated to 500° C. for 30 min, the $V_{bd}$ decreased to less than 1.0 MV/cm. The pinhole density of the deposited layer was not measured.

As discussed previously, the increase in temperature using a CCP-PECVD process led to a better overall film at a cost to the overall thermal budget of the device. Further, deposition using CCP-PECVD with $SiF_4$ and $N_2O$ as reactant gases is not usable in mass production within allowable temperature ranges. However, even at the higher temperatures and using silicon hydrides, the attributes of the deposited film are inferior to the MW-PECVD deposited counterpart.

A first example shows a range of SiO layer characteristics for layers which were deposited by MW-PECVD using $SiH_4$ and $N_2O$ gases. The depositions were performed at 130° C. The flow rate of the $SiH_4$ gas was from 150 sccm to 450 sccm. The flow rate of the $N_2O$ gas was from 2000 sccm to 5000 sccm. The microwave power was supplied to the plasma at 4000 W using 6 antennas. Pressure was maintained at 100 mTorr with a spacing of 5000 mil.

The range of deposition rates achieved was from 850 Å/min up to 2200 Å/min. The range of refractive index for the deposited layer was from 1.462 to 1.471. The range of SiO peak position was from 1074 to 1080, where the peak position can be used for reasonable stoichiometry estimation in case of a homogeneous $SiO_x$ alloy. The range of intrinsic stress for deposited layers, where higher intrinsic stress indicates an increased likelihood of separation from the substrate, was from $2.7*10^9$ d/cm$^2$ to $4.0*10^9$ d/cm$^2$. The range of wet etch rate for the deposited layer was from 1460 Å/min to 1560 Å/min. The hydrogen content of the deposited layer was from 1.8 to 4.0 atomic percent. The flat band voltage ($V_{fb}$) of the deposited layer as deposited was from −10V to −12V. When heated to 500° C. for 30 min, the $V_{fb}$ was from −0.1V to −3.4V. The breakdown voltage ($V_{bd}$) of the deposited layer as deposited was from 5 MV/cm to 11 MV/cm. When heated to 500° C. for 30 min, the $V_{bd}$ saw no calculable change. The pinhole density of the deposited layer was between 6 pinholes/mm$^2$ and 28 pinholes/mm$^2$.

A second example shows a range of SiO layer characteristics for layers which were deposited by MW-PECVD using $SiH_4$ and $O_2$ gases. The depositions were performed at 130° C. The flow rate of the $SiH_4$ gas was from 150 sccm to 450 sccm. The flow rate of the $O_2$ gas was from 2000 sccm to 5000 sccm. The microwave power was supplied to the plasma at 4000W using 6 antennas. Pressure was maintained at 100 mTorr with a spacing of 5000 mil.

The range of deposition rates achieved was from 630 Å/min up to 1900 Å/min. The range of refractive index for the deposited layer was from 1.463 to 1.464. The range of SiO peak position was from 1081 to 1085. The range of intrinsic stress for deposited layers was from $1.9*10^9$ d/cm$^2$ to $2.4*10^9$ d/cm$^2$. The range of wet etch rate for the deposited layer was from 1140 Å/min to 1370 Å/min. The hydrogen content of the deposited layer was 0.8 atomic percent. The flat band voltage ($V_{fb}$) of the deposited layer as deposited was from −0.1V to −3.5V. When heated to 500° C. for 30 min, the $V_{fb}$ was from −0.1V to −1.5V. The breakdown voltage ($V_{bd}$) of the deposited layer as deposited was from 9 MV/cm to 16 MV/cm. When heated to 500° C. for 30 min, the $V_{bd}$ saw no calculable change. The pinhole density of the deposited layer was between 2 pinholes/mm² and 15 pinholes/mm².

A third example shows a range of SiO layer characteristics for layers which were deposited by MW-PECVD using $SiF_4$ and $N_2O$ gases. The flow rate of the $SiF_4$ gas was from 150 sccm to 450 sccm. The flow rate of the $N_2O$ gas was from 3000 sccm to 7000 sccm. The microwave power was supplied to the plasma at 4000 W using 6 antennas. Pressure was maintained at 100 mTorr with a spacing of 5000 mil.

The depositions were performed at temperature from 230° C. to 330° C. The range of deposition rates achieved was from 800 Å/min up to 1900 Å/min. The range of refractive index for the deposited layer was from 1.344 to 1.357. The range of SiO peak position was from 1105 to 1106. The range of intrinsic stress for deposited layers was from $4.0*10^8$ d/cm² to $7.0*10^8$ d/cm². The range of wet etch rate for the deposited layer was greater than 10000 Å/min. The hydrogen content of the deposited layer was from 3.5 atomic percent to 4.5 atomic percent. The flat band voltage ($V_{fb}$) of the deposited layer as deposited was from −15V to −20V. When heated to 500° C. for 30 min, the $V_{fb}$ was from −6V to −12V. The breakdown voltage ($V_{bd}$) of the deposited layer as deposited was 6.5 MV/cm. When heated to 500° C. for 30 min, the $V_{bd}$ was decreased to less than 1.0 MV/cm.

The pinhole density of the deposited layer was not measured due to the high etch rate of the silicon oxide film deposited using $SiF_4$. The pinhole density is generally determined by etching some of the silicon oxide film using a buffered oxide etch (BOE) solution. However, silicon oxide film deposited using $SiF_4$ has a very high wet etching rate by BOE solution. As such, performing a BOE etching on a silicon oxide film deposited using $SiF_4$ leads to the film being completely etched away from the substrate surface. Without intending to be bound by theory, it is believed that the high etch rate is related to high porosity of the silicon oxide film deposited using $SiF_4$ which acts to prevent actual measuring of the porosity.

A fourth example shows a range of SiO layer characteristics for layers which were deposited by MW-PECVD using $SiF_4$ and $O_2$ gases. The flow rate of the $SiF_4$ gas was from 150 sccm to 450 sccm. The flow rate of the $O_2$ gas was from 5000 sccm to 7000 sccm. The microwave power was supplied to the plasma at 4000 W using 6 antennas. Pressure was maintained at 100 mTorr with a spacing of 5000 mil.

The depositions were performed at temperature from 230° C. to 330° C. The range of deposition rates achieved was from 800 Å/min up to 2200 Å/min. The range of refractive index for the deposited layer was from 1.395 to 1.411. The range of SiO peak position was from 1103 to 1104. The range of intrinsic stress for deposited layers was from $1.0*10^8$ d/cm² to $3.0*10^8$ d/cm². The range of wet etch rate for the deposited layer was from 7500 Å/min to 9500 Å/min. The hydrogen content of the deposited layer was from 2.3 atomic percent to 7.5 atomic percent. The flat band voltage ($V_{fb}$) of the deposited layer as deposited was from −0.2V to −4.0V. When heated to 500° C. for 30 min, the $V_{fb}$ was from −1.3V to −4.6V. The breakdown voltage ($V_{bd}$) of the deposited layer as deposited was 7.5 MV/cm. When heated to 500° C. for 30 min, the $V_{bd}$ was decreased to less than 1.0 MV/cm. The pinhole density of the deposited layer was not measured.

The above embodiments, compared to their CCP-PECVD equivalent layers, have a lower deposition temperature, a higher deposition rate, a lower wet etch rate for $SiH_4$ depositions, lower hydrogen contents and a lower pinhole density. In the case of deposition from $SiF_4$ deposition generally, the deposition rate does not appear feasible for wide scale production, as it was almost 20 times lower than the maximum deposition rate available from the MW process. Further, the film produced by the MW plasma process still produced a higher quality film.

Embodiments described herein relate to deposition of SiO on a substrate using a microwave plasma. $SiO_x$ layers can be deposited using either a silicon hydride or a silicon halide alongside an oxidizing agent to provide a conformal layer with a lower hydrogen concentration and lower pinhole density than similar layers formed by CCP-PECVD processes. A MW deposition for $SiO_x$ deposition on a substrate can have numerous advantages over prior art techniques. Advantage of MW for $SiO_x$ deposition include easy to use $O_2$ chemistry, easy to use $SiF_4$ chemistry, low temperature deposition (such as temperatures less than 200° C.), high deposition rate (such as greater than 1000 Å/min), a wide range of process window margin, and a wide range of process chemistry are possible.

While the foregoing is directed to embodiments of the present invention, other and further embodiments of the invention may be devised without departing from the basic scope thereof, and the scope thereof is determined by the claims that follow.

What is claimed is:

1. A method of depositing a film on a substrate, comprising:
   positioning a substrate in a processing chamber;
   maintaining the processing chamber at a temperature below 200° C;
   flowing a reactant gas comprising a silane precursor and an oxidizing precursor into the process chamber, wherein the oxidizing precursor is selected from a group comprising $O_2$, $O_3$, and $N_2O$ and wherein the silane precursor to oxidizing precursor gas ratio is between 7:1 and 33:1;
   applying a microwave power through one or more antennas to create a microwave plasma from the reactant gas, wherein the reactant gas is mixed prior to forming the microwave plasma; and
   depositing a silicon oxide layer on at least a portion of the exposed surface of a substrate.

2. The method of claim 1, wherein the oxidizing precursor comprises $O_2$.

3. The method of claim 1, wherein the silane precursor comprises $SiH_4$.

4. The method of claim 1, wherein the amount of hydrogen in the silicon oxide layer is less than 2 atomic percent.

5. The method of claim 1, wherein the silane precursor is delivered at a flow rate per substrate surface area from 0.027 sccm/cm² to 0.082 sccm/cm².

6. The method of claim 1, wherein the gas ratio is selected to deliver a stoichiometrically equal mix of silane precursor and oxidizing precursor for depositing the silicon oxide layer to the substrate.

7. The method of claim 1, wherein the microwave power is delivered at between 3500 and 4500 watts per antenna.

8. A method of depositing a film on a substrate, comprising:
   positioning a substrate in a processing chamber, wherein the processing chamber is configured to deliver microwave energy from at least two positions;
   maintaining the processing chamber at a temperature less than 200° C.;
   mixing $SiH_4$ and $O_2$ to create a processing gas, wherein the $SiH_4$ to $O_2$ gas ratio is between 7:1 and 33:1;
   flowing the processing gas into the processing chamber;

applying a microwave power to the processing gas to create a microwave plasma; and depositing a silicon oxide layer on at least a portion of the exposed surface of a substrate.

9. The method of claim 8, wherein the amount of hydrogen in the silicon oxide layer is less than 2 atomic percent.

10. The method of claim 8, wherein the $SiH_4$ is delivered at a flow rate per substrate surface area from 0.027 sccm/cm$^2$ to 0.082 sccm/cm$^2$.

11. The method of claim 8, wherein the gas ratio is selected to deliver a stoichiometrically equal mix of $SiH_4$ and $O_2$ for depositing the silicon oxide layer to the substrate.

12. The method of claim 8, wherein the microwave power is delivered at between 3500 and 4500 watts per antenna.

13. The method of claim 8, wherein the temperature is maintained at 130° C.

* * * * *

UNITED STATES PATENT AND TRADEMARK OFFICE
CERTIFICATE OF CORRECTION

| | |
|---|---|
| PATENT NO. | : 8,906,813 B2 |
| APPLICATION NO. | : 13/886175 |
| DATED | : December 9, 2014 |
| INVENTOR(S) | : Won et al. |

It is certified that error appears in the above-identified patent and that said Letters Patent is hereby corrected as shown below:

On the Title Page, item (71) Applicants:

Please delete "Tae Kyung Won, San Jose, CA (US); Seon-Mee Cho, Santa Clara, CA (US); Soo Young Choi, Fremont, CA (US); Beom Soo Park, San Jose, CA (US); Dong-Kil Yim, Pleasanton, CA (US); John M. White, Hayward, CA (US); Jozef Kudela, San Jose, CA (US)" and insert --Applied Materials, Inc., Santa Clara, CA (US)-- therefor;

In the Specification:

Column 5, Line 34, please delete "1228" and insert --122B-- therefor.

Signed and Sealed this
Second Day of June, 2015

Michelle K. Lee
*Director of the United States Patent and Trademark Office*